United States Patent
Ohkubo

(10) Patent No.: US 7,304,749 B2
(45) Date of Patent: Dec. 4, 2007

(54) POINT DIFFRACTION INTERFEROMETER AND EXPOSURE APPARATUS AND METHOD USING THE SAME

(75) Inventor: Akinori Ohkubo, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 361 days.

(21) Appl. No.: 11/064,558

(22) Filed: Feb. 24, 2005

(65) Prior Publication Data

US 2005/0190377 A1    Sep. 1, 2005

(30) Foreign Application Priority Data

Feb. 27, 2004    (JP)    ............... 2004-055264

(51) Int. Cl.
   *G01B 9/02*    (2006.01)
(52) U.S. Cl. ............ 356/521; 356/499; 356/494; 356/515
(58) Field of Classification Search .......... 356/521, 356/499, 494, 515
   See application file for complete search history.

(56) References Cited

U.S. PATENT DOCUMENTS

| 5,076,695 A | 12/1991 | Ichihara | |
| 5,457,533 A * | 10/1995 | Wilcken | 356/491 |
| 5,835,217 A | 11/1998 | Medecki | |
| 2002/0044287 A1* | 4/2002 | Otaki | 356/521 |
| 2002/0191195 A1* | 12/2002 | Ichihara et al. | 356/521 |

FOREIGN PATENT DOCUMENTS

| JP | 57-064139 | 4/1982 |
| JP | 2-228505 | 2/1990 |
| JP | 2001-227909 | 8/2001 |

* cited by examiner

*Primary Examiner*—Gregory J. Toatley, Jr.
*Assistant Examiner*—Abdullahi Nur
(74) *Attorney, Agent, or Firm*—Morgan & Finnegan, LLP

(57) ABSTRACT

A point diffraction interferometer measures optical performance of a target optical system based on a light intensity distribution of an interference fringe through an interference between a wave front that passes the target optical system and a reference wave front generated from a pinhole, wherein the pinhole satisfies $1.05 \leq \text{ellipticity} \leq 1.16$, where the ellipticity is defined as a diameter of a pinhole in a direction perpendicular to a linear polarization direction of light incident upon the pinhole, divided by a diameter of the pinhole in the linear polarization direction.

8 Claims, 13 Drawing Sheets

POINT DIFFRACTION INTERFEROMETER AND EXPOSURE APPARATUS AND METHOD USING THE SAME

BACKGROUND OF THE INVENTION

The present invention relates generally to a method and apparatus for measuring the performance of an optical element, and more particularly to a point diffraction interferometer ("PDI") that uses a wave front generated from a pinhole as a reference spherical wave in measuring a wave front of a projection optical system that transfers a mask pattern onto an object, and an exposure apparatus and method using the PDI. The inventive PDI is suitable, for example, for an apparatus for measuring the optical performance of the projection optical system that uses the soft X-ray or the extreme ultraviolet light ("EUV") as exposure light.

A reduction projection exposure apparatus has been conventionally employed which uses a projection optical system to project a circuit pattern of a mask (reticle) onto a wafer, etc. to transfer the circuit pattern, in manufacturing such a fine semiconductor device as a semiconductor memory and a logic circuit in the photolithography technology. The minimum critical dimension to be transferred by the projection exposure apparatus or resolution is proportionate to the wavelength of the exposure light, and inversely proportionate to the numerical aperture ("NA") of the projection optical system. The shorter the wavelength is, the better the resolution is. Along with recent demands for finer processing to the semiconductor devices, a shorter wavelength of ultraviolet light has been promoted from an ultra-high pressure mercury lamp (i-line with a wavelength of approximately 365 nm) to a KrF excimer laser (with a wavelength of approximately 248 nm), an ArF excimer laser (with a wavelength of approximately 193 nm), and finally the EUV light having a wavelength between about 10 nm and about 15 nm.

Due to the extremely large light absorption in a material in a wave range of the EUV light, an exposure apparatus that uses the EUV light (or an "EUV exposure apparatus") typically uses a catoptric optical system. The reflective optical element typically uses a multilayer coating mirror that alternately layers two types of materials having different optical constants, and a multilayer coating mirror in the projection optical system needs very high precision for its surface shape. Equation 1 below derived from the Marechal's criterion gives a permissible shape error σ (rms value), where n is the number of multilayer coating mirrors in the projection optical system, and λ is a wavelength of the EUV light:

$$\sigma = \frac{\lambda}{28 \times \sqrt{n}} \quad \text{[EQUATION 1]}$$

For example, six multilayer coating mirrors in the projection optical system that uses the EVU light with a wavelength of 13 nm is permitted to have a shape error σ of 0.2 nm. The permissible wave front aberration amount for the entire projection optical system is about 0.4 nm for the resolution of 30 nm pattern transferring. The conventional surface precision measuring apparatus is insufficient in precision to measure such a highly precise surface shape. Therefore, an application of the PDI that has a high measuring precision has been studied.

The PDI has been conventionally known as an apparatus that accurately measures a wave front aberration of the projection optical system. See, for example, Japanese Patent Application, Publication No. 57-64139, U.S. Pat. No. 5,835,217, and Daniel Malacara, "Optical Shop Testing", John Wiley & Sons, Inc. 231 (1978). The PDI uses the light exited from a pinhole as a reference spherical wave, and the pinhole has a perfectly circular shape, because of the recognition and experience that the perfectly circular pinhole is likely to generate an ideal spherical wave. Since it is sufficient that the pinhole is shaped like a perfect circle when viewed from the incident direction, the pinhole can be shaped like an ellipse when it is inclined to the incident direction. See, for example, Japanese Patent Application, Publication No. 2-228505. Use of a circular polarization for the light incident upon the pinhole is also proposed rather than the linear polarization in order to reduce or eliminate the wave front error caused by the polarization state. See, for example, Japanese Patent Application, Publication No. 2001-227909.

As pointed out in Japanese Patent Application, Publication No. 2001-227909, the wave front exited from the pinhole ("pinhole exited wave front") fluctuates according to polarization directions of the light incident upon the pinhole, offsets from the ideal spherical wave, and cannot maintain the predetermined measurement precision. As pointed out in Japanese Patent Application, Publication No. 2001-227909, the incident light upon the pinhole approaching to the circular polarization would reduce the polarization caused error of the pinhole exited wave front. However, the optical element other than the pinhole cannot maintain a constant polarization state due to the polarization dependency, such as a reflection and refraction, or provide precise measurements. In other word, a method disclosed in Japanese Patent Application, Publication No. 2001-227909 cannot necessarily obtain the highly precise measurements of about 0.1 RMS.

BRIEF SUMMARY OF THE INVENTION

The present invention is directed to a PDI, an exposure apparatus and method using the PDI, and a device manufacturing method, which can reduce an offset between an ideal spherical wave and an exited wave front from a pinhole, and precisely measure the optical performance of a target optical system.

A point diffraction interferometer according to one aspect of the present invention measures optical performance of a target optical system based on a light intensity distribution of an interference fringe through an interference between a wave front that passes the target optical system and a reference wave front generated from a pinhole, wherein the pinhole satisfies $1.05 \leq \text{ellipticity} \leq 1.16$, where the ellipticity is defined as a diameter of a pinhole in a direction perpendicular to a linear polarization direction of light incident upon the pinhole, divided by a diameter of the pinhole in the linear polarization direction.

A point diffraction interferometer according to another aspect of the present invention for measuring optical performance of a target optical system based on a light intensity distribution of an interference fringe through interference between a wave front that passes the target optical system and a reference wave front generated from a pinhole, includes a mechanism for rotating at least one of an incident polarization direction and the target optical system, and a mechanism for aligning a shorter diameter of the pinhole with the incident polarization direction.

Other objects and further features of the present invention will become readily apparent from the following description of the preferred embodiments with reference to accompanying drawings.

DETAILED DESCRIPTION OF THE PREFERRED EMBODIMENTS

Figure 1:
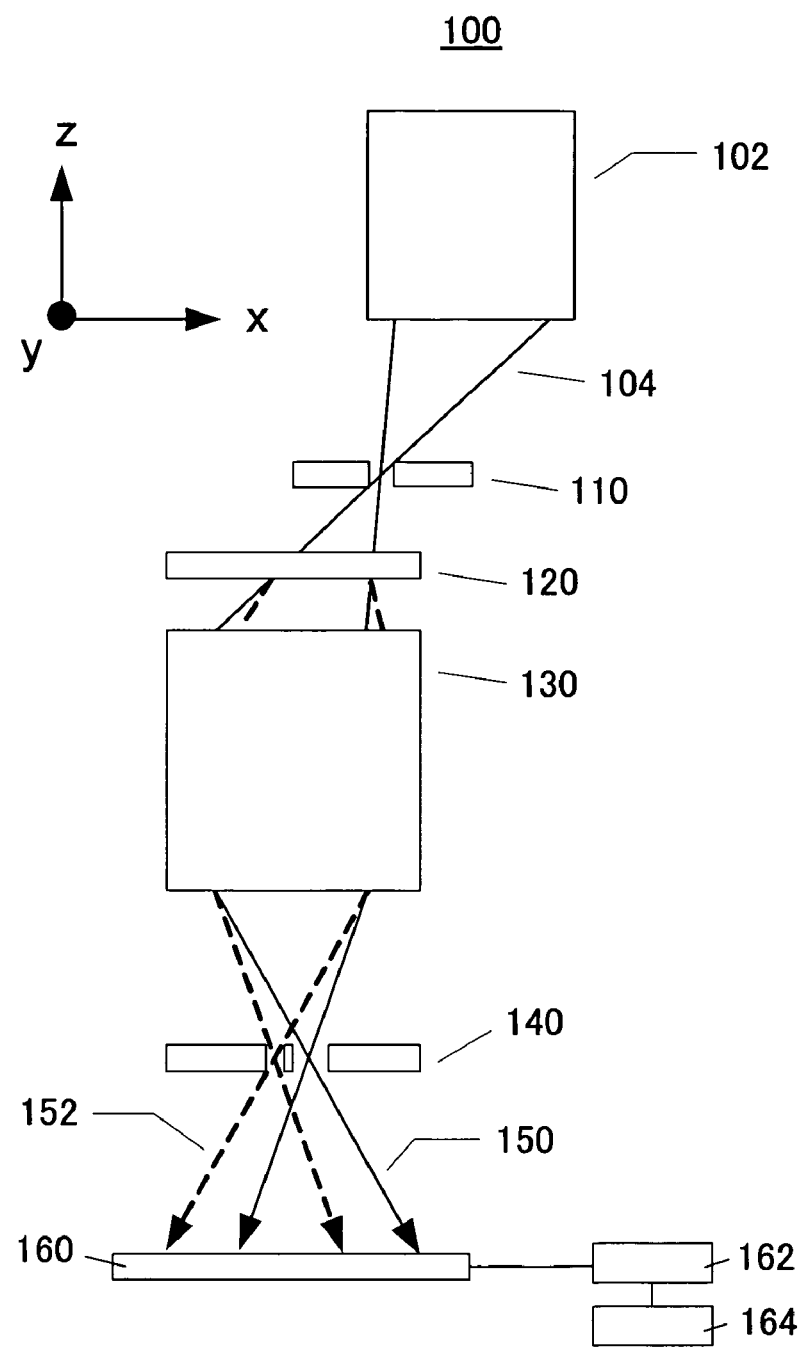
FIG. 1 is an optical-path diagram of a PDI according to one embodiment of the present invention.

A description will now be given of a phase shift PDI 100 as one illustrative PDI example according to one embodiment of the present invention and its operation. Here, FIG. 1 is an optical-path diagram of the phase shift PDI 100. In FIG. 1, 102 denotes an illumination optical system, and 104 denotes the light exited from the illumination optical system. 110 denotes a first mask. 120 denotes a grating. 130 denotes a target optical system. 140 denotes a second mask. 150 denotes one of diffracted light by the grating, which passes a window 146 in the mask 140. 152 denotes another diffracted light by the grating, which has an order different from the light 150, and generated from a pinhole 142 in the mask 140. 160 denotes a detector, such as a CCD. 162 is a controller connected to the detector 160. 164 is a memory.

Figure 2A:
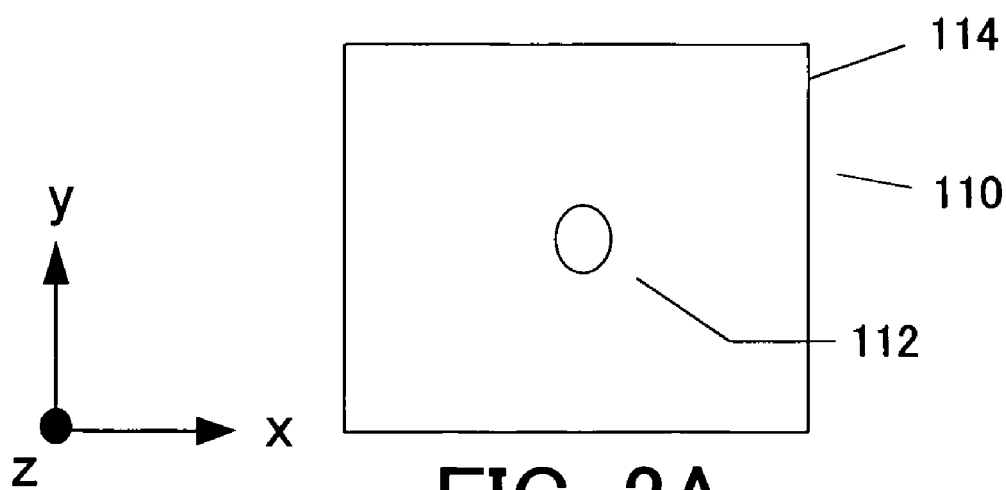
FIGS. 2A-2C are plane views of two masks and a grating in the PDI shown in FIG. 1.
Figure 2B:
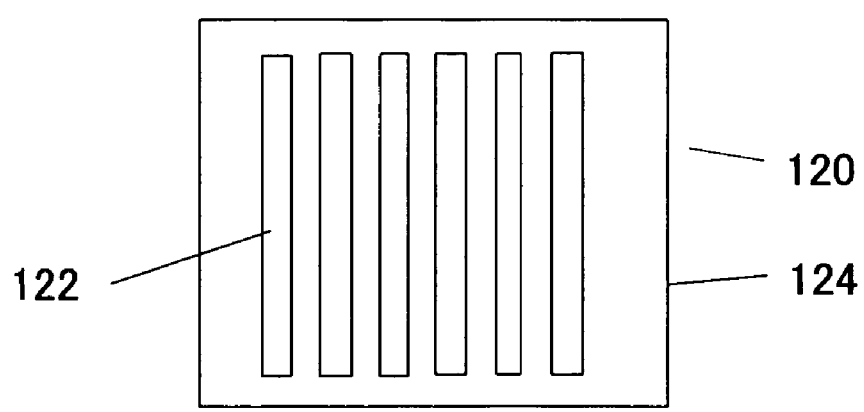
Figure 2C:
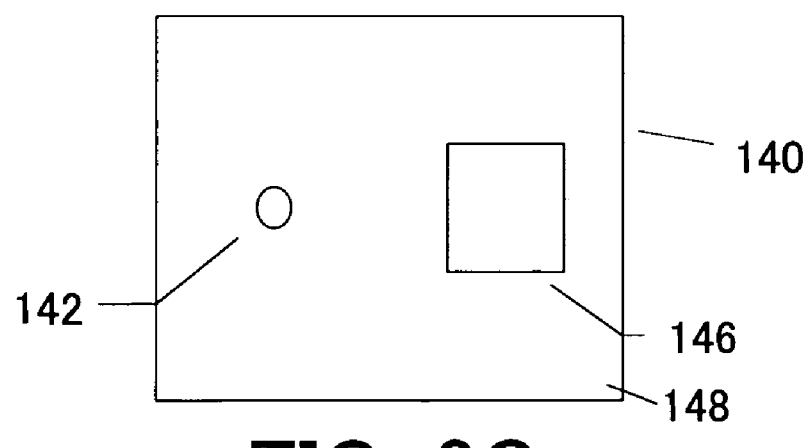

FIGS. 2A to 2C are plane views of the mask 110, the grating 120 and the mask 140. The mask 110 has a pinhole 112 as an opening and a light-shielding part 114. The grating 120 has openings 122 and a light-shielding part 124. The mask 140 has a pinhole 142 and a window 146 as an opening, and a light-shielding part 148.

The illumination optical system 102 includes a combination of a light source and optical elements, and has an aberration greater than the target optical system 130. Therefore, the exited light 104 is irradiated onto the pinhole 112 in the mask 110, and generates a spherical wave that has a reduced aberration utilizing the pinhole 112. This spherical wave transmits through the grating 120, and generates several orders of diffracted lights. These diffracted lights transmit through or reflect on the projection optical system 130. Certain diffracted lights, such as the ±1st order diffracted lights, transmit the window 146 in the mask 140, and another light, such as the 0th order light, transmits the pinhole 142. The light 150 that transmits the window 146 has a wave front aberration resulting from a surface precision error and an adjustment error of the target optical system 130. On the other hand, the light 152 generated from the pinhole 142 has a wave front close to the ideal spherical wave as a result of the diffraction through the pinhole 142. The detector 160 detects the intensity pattern generated as a result of superimposition between the light 152 as reference light and the light 150. The controller 162 analyzes the detected light intensity pattern, and obtains a surface precision error of the projection optical system 130 as described later.

Figure 3:
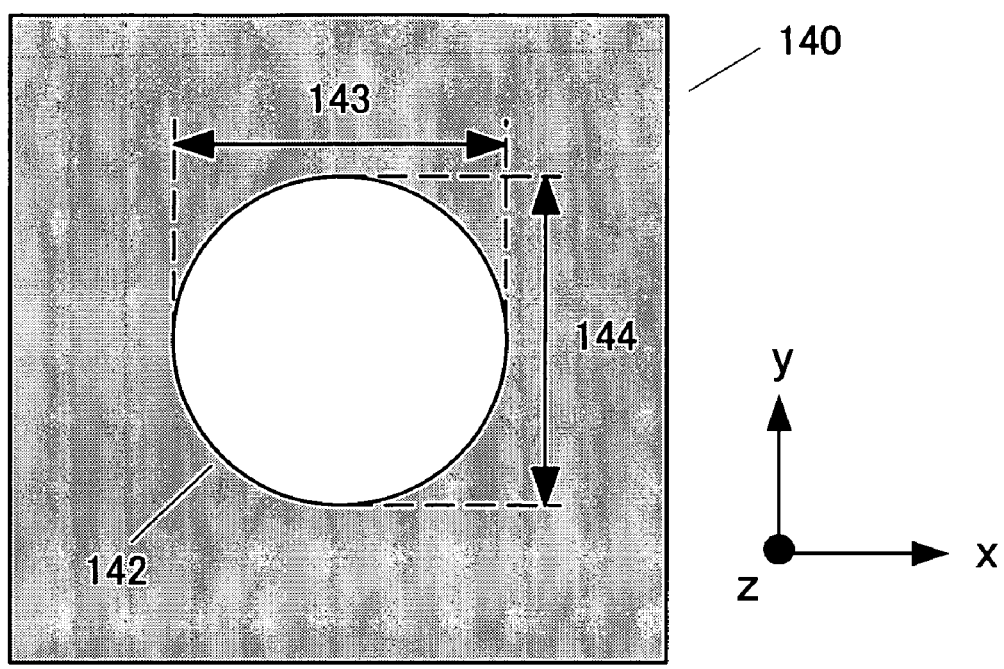
FIG. 3 is an enlarged view of a pinhole in the mask shown in FIG. 2C.

The PDI 100 lowers the measuring precision when there is an offset between the wave front of the ideal spherical wave and the wave front exited light from the pinhole 142 as the reference spherical wave. FIG. 3 is an enlarged plane view of the pinhole 142, where the incident polarization direction is an x direction.

Figure 4:
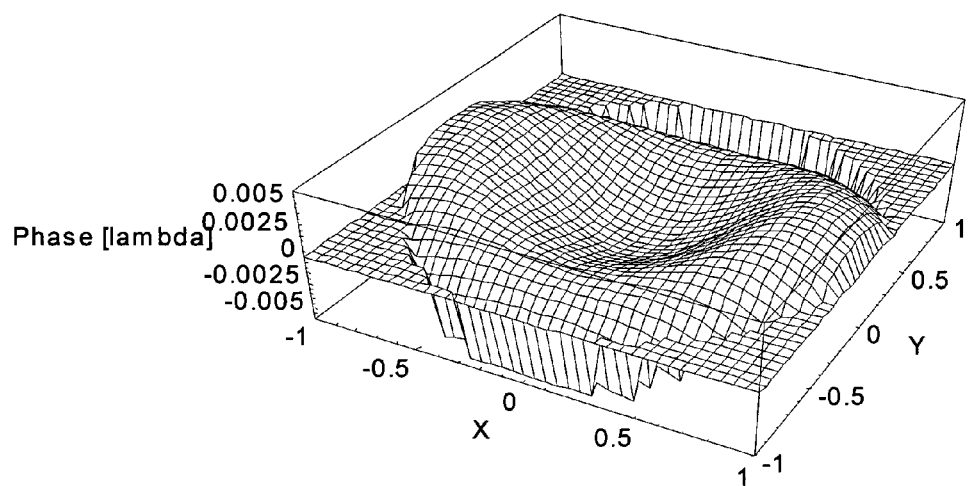
FIG. 4 is an exited wave front view from the pinhole shown in FIG. 3 when the pinhole has a perfectly circular shape.

First, the inventor has studied an approach of the polarization direction to the linear polarization so as to make constant the influence of the polarization dependency of the optical element, such as 102, in the PDI 100. The pinhole 142 uses a perfectly circular pinhole that equalizes both of the pinhole diameter 143 in the x direction shown in FIG. 3 and the pinhole diameter 144 in the y direction to 45 nm. The mask 140 is made of Ni and has a thickness of 150 nm so that the incident light irradiated onto the outside of the pinhole 142 sufficiently attenuates. Relative to the ideal spherical wave, the wave front exited from the pinhole 142 is found to have an error similar to the astigmatism resulting from the polarization direction as shown in FIG. 4 when the light has a wavelength of 13.5 nm and the NA of the optical system is 0.26. Here, FIG. 4 is a view of a wave front exited from the perfectly circular pinhole. A value of the Peak to Valley of the wave front error, which is referred to as a "wave front P-V value" hereinafter, is about 13 m$\lambda$, where $\lambda$ is a wavelength of the light incident upon the pinhole. The x-axis and y-axis in FIG. 4 define a normalized coordinate. The incident polarization direction is defined as a direction of the longer principal axis in the ellipse of a locus of the electric vector top. An offset between the wave front exited from the pinhole 142 and the ideal spherical wave will be simply referred to as an exited wave front aberration. It is understood from FIG. 4 that the exited wave front from the perfectly circular pinhole deforms the light of the original spherical shape. The asymmetry of the wave front shape in FIG. 4 results from differences in the induced current distribution near the surface layer of the mask according to incident polarization directions due to interactions between the incident light upon the pinhole 142 and the mask 140. This wave front error causes the measuring error of the PDI 100, and undesirably deteriorates the measuring precision.

Figure 5:
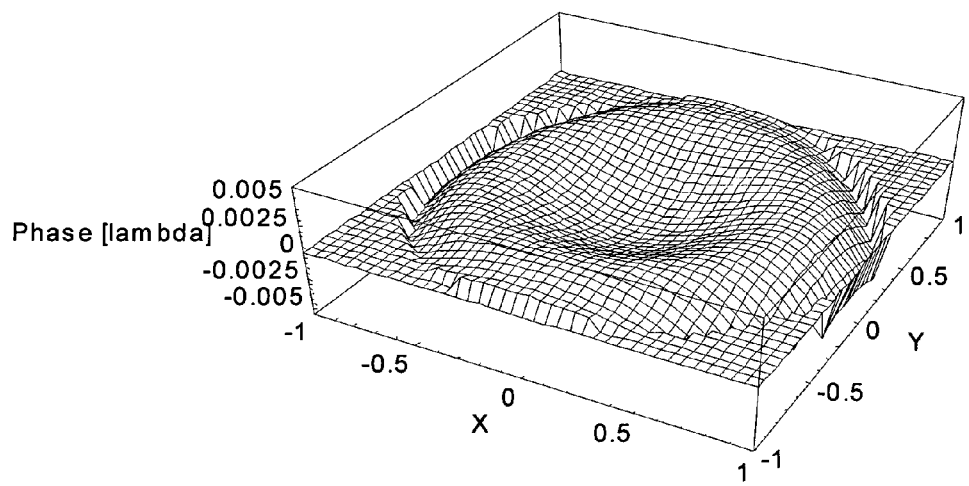
FIG. 5 is an exited wave front view from the pinhole shown in FIG. 3 when the pinhole has an elliptical shape.

Accordingly, the present inventor has studied a conversion of the pinhole 142 into an elliptical shape where pinhole diameter 143 in the x direction is shorter than the pinhole diameter 144 in the y direction in order to reduce the polarization dependency of the exited wave front shape from the pinhole 142. This embodiment sets the pinhole diameter in the x direction to 45 nm and the pinhole diameter 144 in the y direction to 50 nm. Then, as shown in FIG. 5, the wave front exited from the pinhole 142 becomes closer to the ideal spherical wave than the example shown in FIG. 4. More specifically, the wave front P-V value is about 7 m$\lambda$, and the exited wave front aberration reduces by half. The incident polarization direction is x direction. It is thereby understood that the polarization dependency of the exited wave front shape reduces by using the elliptical pinhole in which the diameter in the incident polarization direction is smaller than the diameter in the direction perpendicular to the incident polarization direction.

Next, the instant inventor has studied a relationship between the wave front aberration generated from the perfectly circular pinhole and the wave front aberration generated from the elliptical pinhole by changing the ellipticity that is defined as follows:

Ellipticity=(Diameter of Pinhole perpendicular to Incident Polarization Direction)/(Diameter of Pinhole in the Incident Polarization Direction) [EQUATION 2]

In FIG. 3, the diameter 144 is the diameter of pinhole perpendicular to the incident polarization direction, and the diameter 143 is the diameter of the pinhole in the incident polarization direction.

Figure 6:
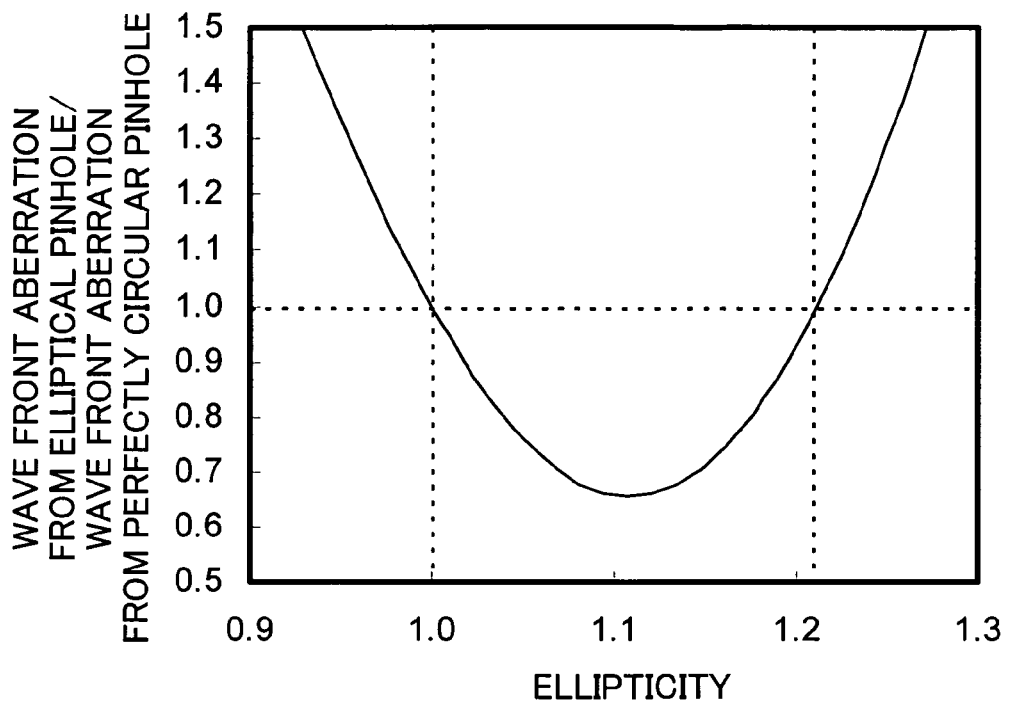
FIG. 6 is a view showing a reduction effect of an exited wave front aberration to the ellipticity.

The exited wave front aberration is calculated by changing the ellipticity of the elliptic pinhole, and normalized by the exited wave front aberration from the perfectly circular pinhole. The ellipticity is changed so that the pinhole has the constant area. FIG. 6 shows this result. The ellipticity equal to 1 means the perfectly circular pinhole. For improvement of the wave front aberration rather than that from the perfectly circular pinhole, the following Equation 3 should be met from FIG. 6.

(Wave Front Aberration from Elliptical Pinhole)/
(Exited Wave Front from Perfectly Circular Pinhole)<1 [EQUATION 3]

It is understood from FIG. 6 that Equation 3 is equivalent to Equation 4. In other words, the ellipticity that satisfies Equation 4 has the improvement shown in FIG. 5:

1.0<Ellipticity<1.2 [EQUATION 4]

Figure 7:
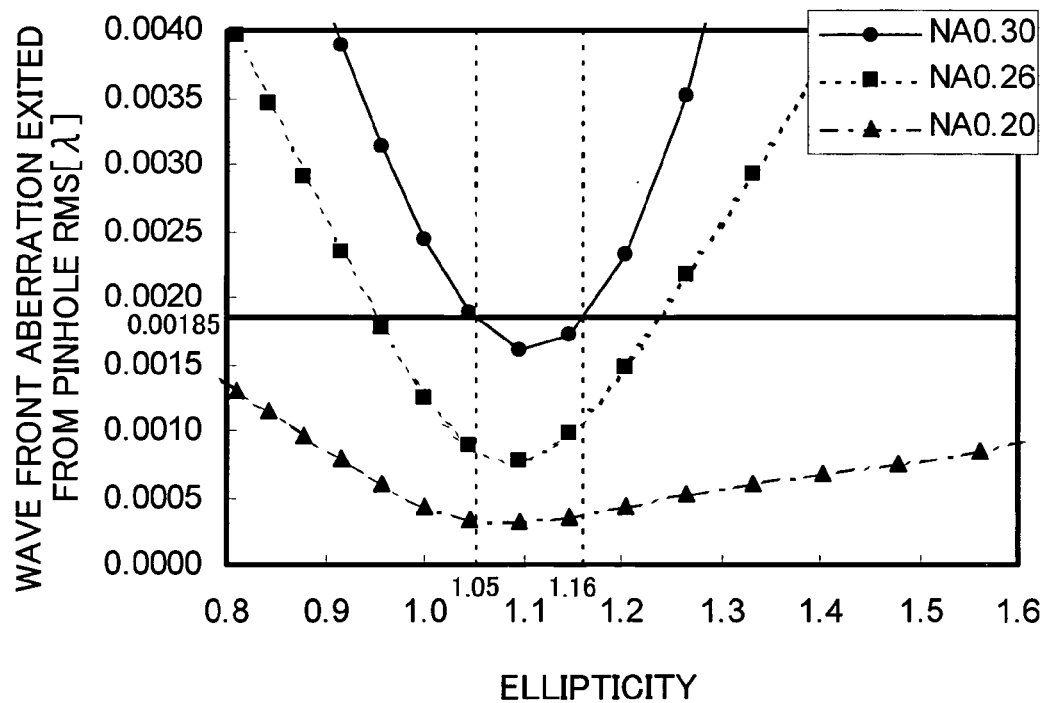
FIG. 7 is a view showing a relationship between the pinhole exited wave front aberration and the ellipticity with different numerical apertures of a target optical system.

The ellipticity that satisfies Equation 4 exhibits the improvement as shown in FIG. 5, but it is necessary to identify the ellipticity that provides the given measuring precision. Accordingly, the instant inventor has studied a relationship between the ellipticity and the wave front aberration of the light exited from the pinhole 142 with respect to different NAs of 0.20, 0.26 and 0.30 of the projection optical system 130. FIG. 7 shows this result. It is understood, as shown in FIGS. 6 and 7, that the wave front aberration has a minimum value near the ellipticity of 1.1 with respect to all the NAs. In addition, FIG. 7 shows that the minimum value is little affected by the NA. As a result, the instant inventor has discovered that when the ellipticity is set to the minimum value, the wave front aberration becomes minimum and the given measuring precision can be satisfied as shown in FIG. 7. However, due to the graphing errors in FIG. 7, the position of the minimum value should be recognized as about 1.1±0.05. As a result, the instant inventor has discovered that the minimum value exists in a range between two lines or a range that satisfies the following Equation 5:

1.05≦Ellipticity≦1.16 [EQUATION 5]

Where the target optical system is the projection optical system applied to the EUV exposure apparatus, understandably, the boundary that satisfies Equation 4 is 0.00185 RMS($\lambda$) for the highest available NA of 0.3 to date as shown by a solid line shown in FIG. 7, and sufficiently reduces the offset between the pinhole 142 exited wave front and the ideal spherical wave. In other words, the PDI 100 of this embodiment exhibits a high measuring precision of about 0.1 nm RMS.

When the diameter of the pinhole 142 is normalized with $\lambda$/NA and Equation 6 below is satisfied, the pinhole exited wave front approaches to the ideal spherical wave. Thus, the PDI has a high measuring precision and is less affected by the aberration of the projection optical system.

0.7≦Normalized Pinhole Diameter≦0.9 [EQUATION 6]

When the mask 140 is viewed from the perpendicular direction, the shape of the pinhole 142 can differ between the top and bottom surfaces of the mask 140, and the pinhole diameter can differ between the top and bottom surfaces of the mask 140. This embodiment defines the pinhole diameter as the minimum value of the pinhole diameters between the top and bottom surfaces of the mask 140.

Figure 8:
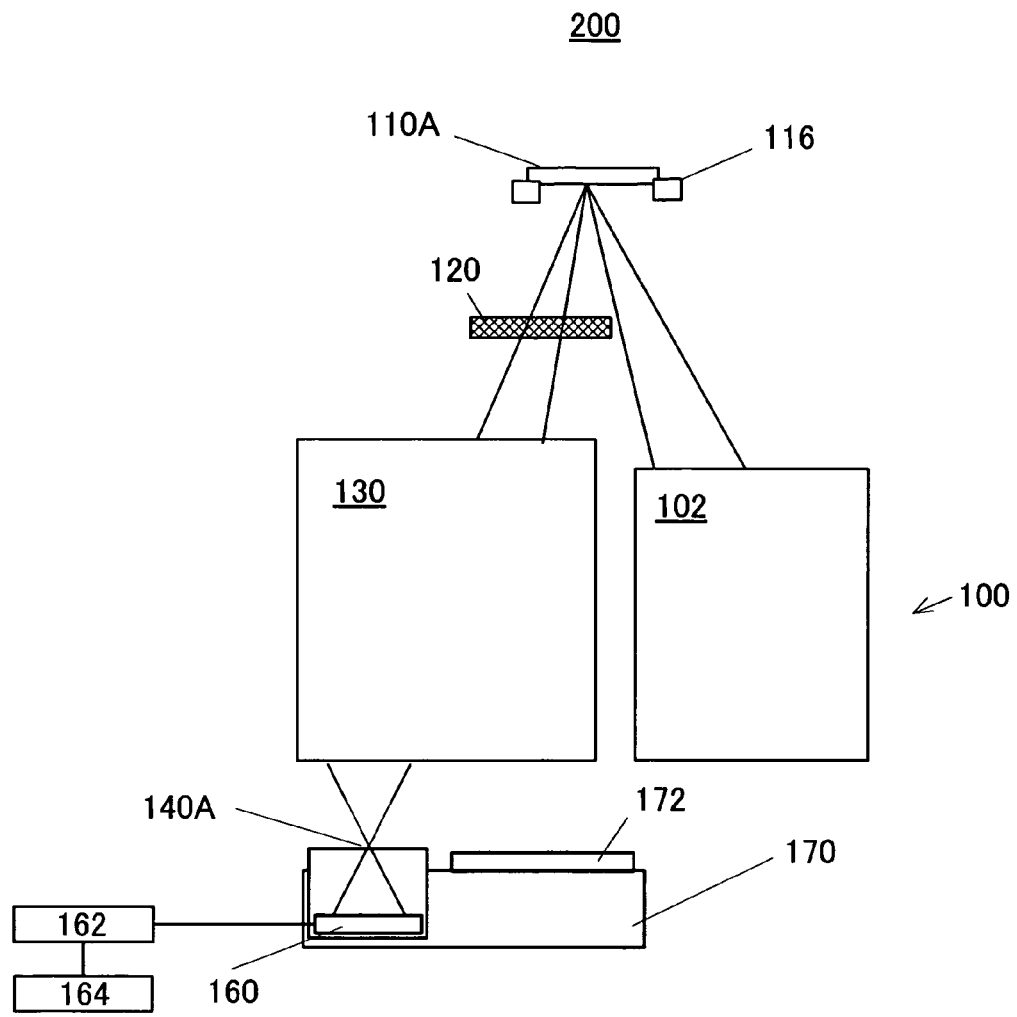
FIG. 8 is an optical-path diagram of an exposure apparatus mounted with the PDI shown in FIG. 1.

Referring now to FIG. 8, a description will be given of the exposure apparatus 200 mounted with the measuring apparatus 100. Here, FIG. 8 is a schematic block diagram of the exposure apparatus 200 that uses the EUV light as the exposure light. Of course, the inventive exposure apparatus is not limited to the EUV light. The exposure apparatus 200 measures the optical performance of the projection optical system 130 as a target optical system using the measuring apparatus 100, adjusts the projection optical system 130, and exposes the object 172 to be exposed via the adjusted projection optical system 130. Those elements in FIG. 8, which are the corresponding elements in FIG. 1, are designated by the same reference numeral, and a description thereof will be omitted. The exposure apparatus 200 may apply the PDIs 100A and 100B, which will be described later.

In FIG. 8, 110A denotes a mask that has the pinhole 112 shown in FIG. 2 as a reflection pinhole. While the mask 110A is mounted on and supported by the mask stage 116, the mask stage 116 is mounted with a mask that is integrated with or separate from the mask 110A. The mask 110A in this embodiment forms both the circuit pattern and the pinhole 112.

130 denotes a projection optical system as the target optical system that includes four to six multilayer coating mirrors. Similar to FIG. 1, the grating 120 is located at the side of the mask stage 116, but may be located at the side of the wafer stage 170. 140A denotes a pattern surface on which the pinhole 142 and the window 146 are arranged. 172 denotes the object to be exposed or a wafer in this embodiment. The pattern surface 140A and the detector 160 are integrated in this embodiment, and arranged on the wafer stage 170.

With the above configuration, the illumination optical system 102 illuminates the mask 110A, the diffraction grating 120 splits the spherical wave exited from the pinhole 112, and the projection optical system 130 introduces the 0th order light to the pinhole 142 in the pattern 140A and the 1st order light to the window 146 so that the detector can obtain the interference fringe. The interference fringe has a tilt fringe that corresponds to a separation angle between the 0th order light and the 1st order light, and the phase of the interference fringe is obtained by applying the Moire method etc. PST and a calculation means (not shown) to the interference fringe obtained by the detector 160. Alternatively, the phase of the interference fringe can be obtained by the phase-shift method that utilizing a scanning means (not shown) to scan a diffraction optical element perpendicular to an optical axis of the projection optical system 130. Furthermore, the wave front aberration information can be obtained at all the angles of field of the projection optical system 130. The controller 162 removes a rotationally asymmetrical component from the wave front aberration at each angle of field, and thereby can calculate the distortion component of the projection optical system 130. The controller 162 can calculate the curvature of field of the projection optical system 130 from the rotationally asymmetrical component in the wave front aberration.

The PDI 100 conducts two or more measurements by rotating the incident polarization direction or the optical system, and reduces or eliminates the influences of the system error of the PDI 100 itself and the polarization dependency of the optical system on the measurements. An alignment of the incident polarization direction with the minor axis direction of the elliptical pinhole would eliminate fluctuations of the pinhole exited wave front and improve the measuring precision.

Figure 9:
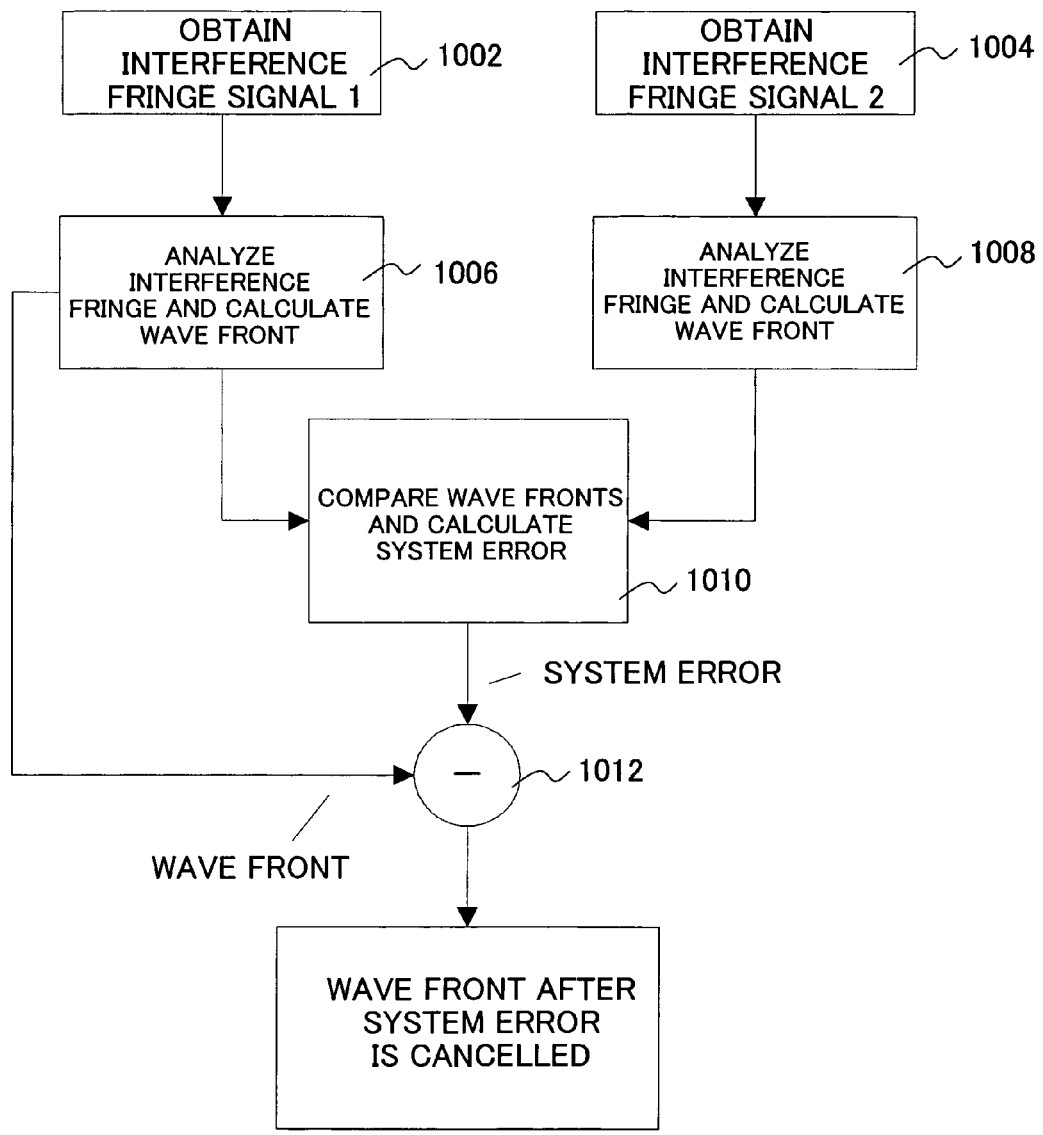
FIG. 9 is a flowchart of the interference fringe analysis for use with a system error reduction.

Referring to FIG. 9, a description will be given of a method to reduce the system error of the PDI 100. Here, FIG. 9 is a flowchart for explaining a method for reducing the system error of the PDI 100. The method in FIG. 9 conducts two measurements by rotating an optical system that has little polarization direction dependency, compares the wave front (step 1006) obtained from an interference fringe signal 1 obtained at the initial state (step 1002) with the wave front (step 1008) calculated from an interference fringe signal 2 obtained at a 90° rotated state (step 1004), and calculates the system error based on the difference (step 1010). The measurement result approaches to the wave front that has no system error, by subtracting this system error from the wave front (step 1012). The measurement precision improves by calculating the optical performance of the target optical system 130 using this wave front.

Figure 10:
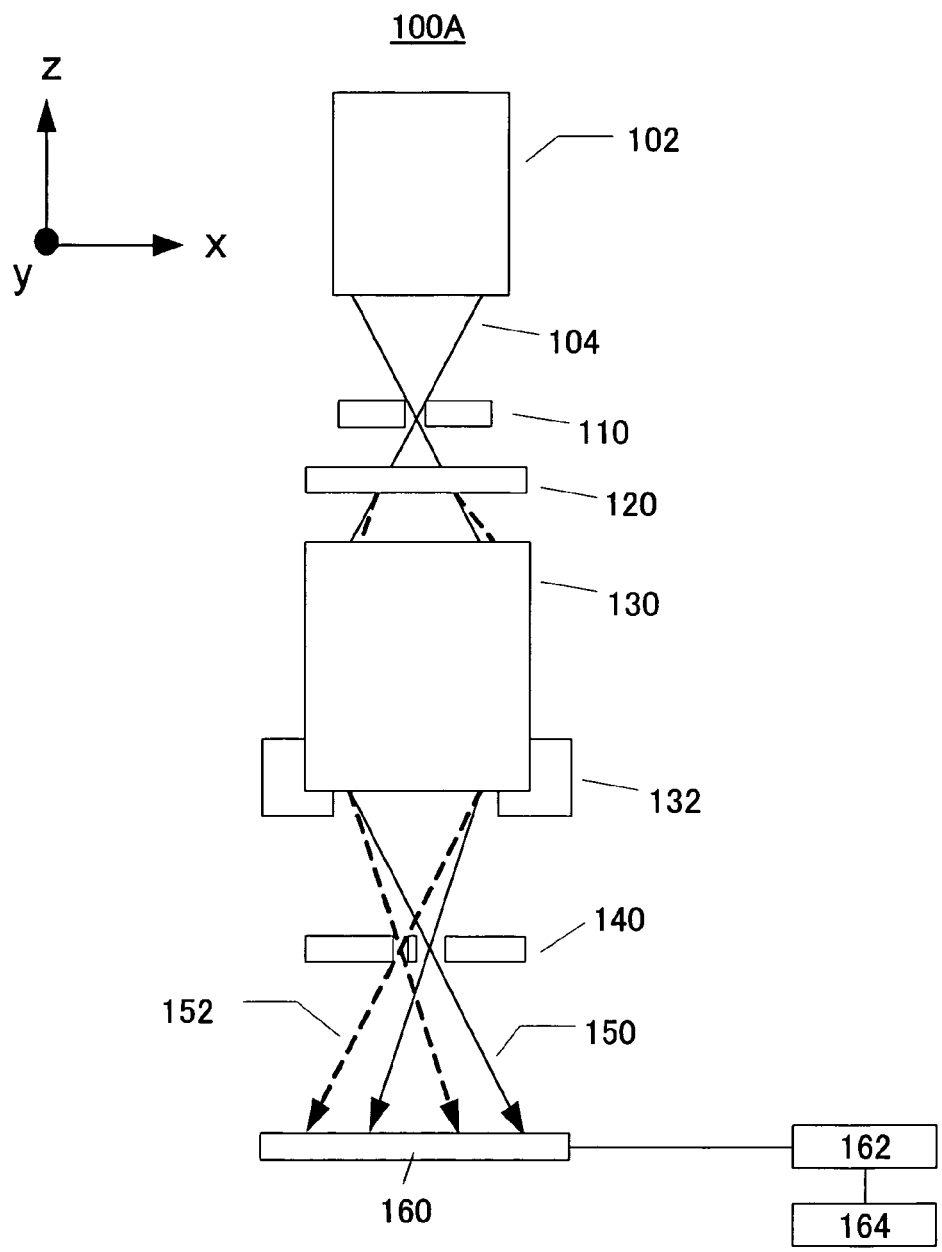
FIG. 10 is an optical-path diagram of a variation of the PDI shown in FIG. 1.

Referring now to FIG. 10, a description will be given of a method for removing or eliminating the influence of the polarization dependency of the optical system on the measurement precision. Here, FIG. 10 is a block diagram of the PDI 100A that implements this method. The PDI 100A shown in FIG. 10 is different from the PDI shown in FIG. 1 in that the PDI 100A includes a rotating mechanism 132 of the target optical system 130. Use of the PDI 100A that includes the rotating mechanism 132 can provide more precise measurements by considering the system error calculated with the optical system that has little polarization dependency. Since FIG. 10 fixes the polarization direction of the illumination light 104 and rotates only the projection optical system 130, the minor axis direction of the elliptical pinhole 142 is fixedly accorded with the incident polarization direction independent of the optical system. When the optical system is not rotationally symmetrical, the rotation of the optical system in the optical-axis direction becomes difficult.

Figure 11:
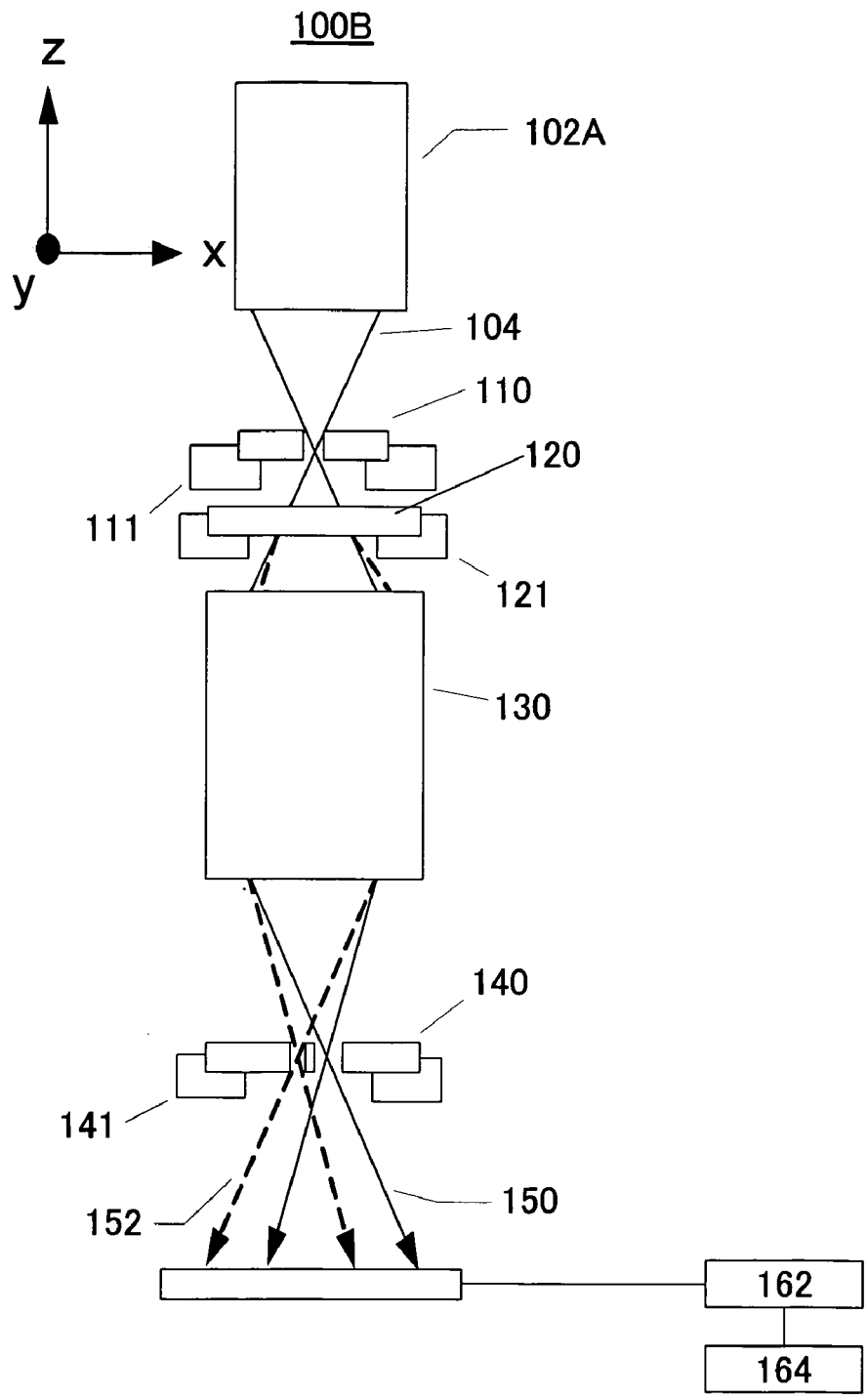
FIG. 11 is an optical-path diagram of a variation of the PDI shown in FIG. 10.

This problem can be solved by a mechanism for rotating the incident polarization direction of the illumination light 104 as shown in FIG. 11. In FIG. 11, 102A denotes an illumination optical system having a variable polarization direction. 111 denotes a stage for rotating the mask 110. 121 denotes a stage for rotating a grating 120. 141 denotes a stage for rotating the mask 140.

Figure 12A:
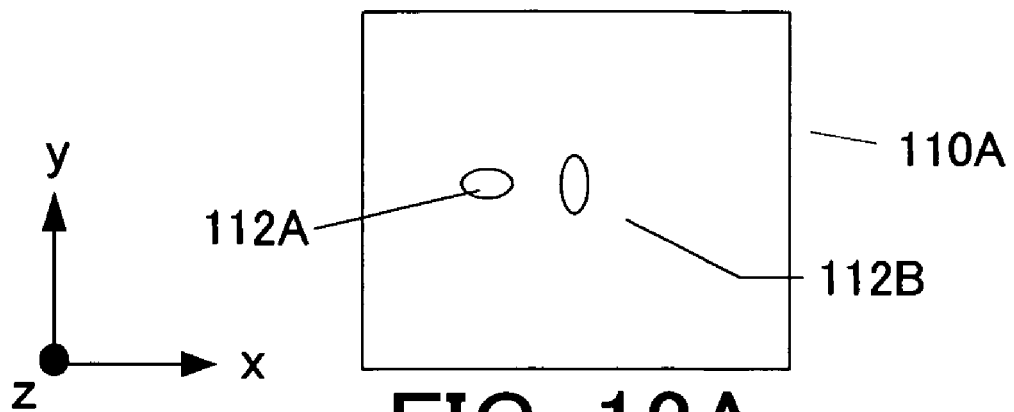
FIGS. 12A and 12B are plane views of a mask applicable to the PDI shown in FIG. 10.
Figure 12B:
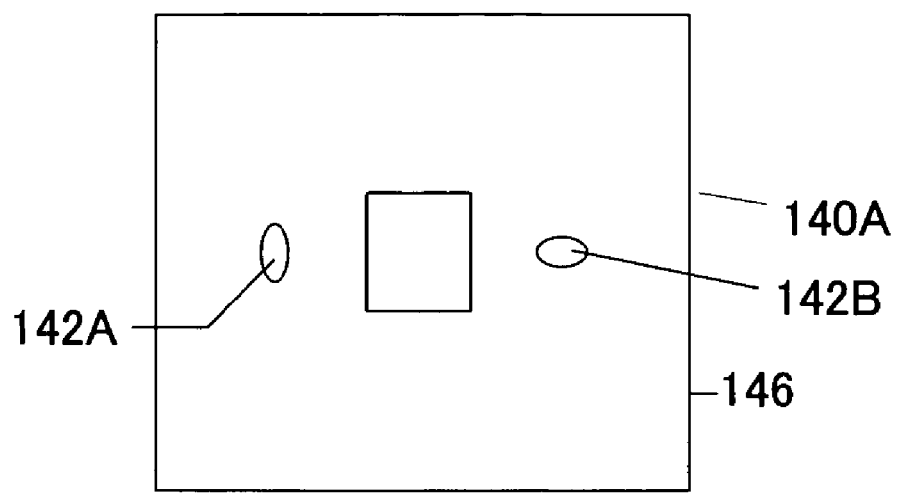

In FIG. 11, when the polarization direction of the illumination light 104 changes, the stage mask 140 is rotated or moved so that the minor axis direction of the elliptical pinhole accords with the polarization direction. The number of pinholes is not limited to one in the pinhole mask, and the mask may have plural pinholes 112A, 112B, 142A, 142B having different minor axis directions of the ellipse as shown in FIGS. 12A and 12B and switch the applied pinhole in accordance with the polarization direction. Here, FIGS. 12A and 12B are plane views of a mask 110A and a mask 140A applicable to the PDI 100B. One of the pinhole 112A and 112B rotates relative to the other by 90°, and one of the pinhole 142A and 142B rotates relative to the other by 90°. Thus, the inventive control over the ellipticity is applicable to the pinhole 112.

The measurement precision can improve through two or more measurements by rotating the target optical system around the optical axis by 90° or by rotating the polarization direction of the incident light by 90°, and by using the average of these measurements. The fluctuations of the pinhole exited wave front according to polarization directions can be eliminated and the highly precise PDI can be implemented by using a mechanism for according the minor axis direction of the elliptical pinhole with the incident polarization direction.

A scanning electron microscope ("SEM") etc. can measure the shape error of the pinhole, but cannot measure the exited wave front. The PDI 100 can improve its measurement precision by calculating a wave front shape exited from the pinhole using the strict numerical calculation and the pinhole shape, storing an offset between the calculated wave front shape and the ideal spherical shape in the memory 164 etc., and calculating the wave front using the interferometer and taking the offset into account.

In producing the pinhole 142, an error occurs due to the design value that affects the measurement precision. Since the PDI 100 has the mechanism that accords the minor axis direction of the pinhole 142 with the incident polarization direction, the wave front aberration exited from the pinhole reduces according to the incident polarization directions and the measuring precision improves. This mechanism works when the pinhole 142 deforms thermally or due to contaminations.

Figure 13:
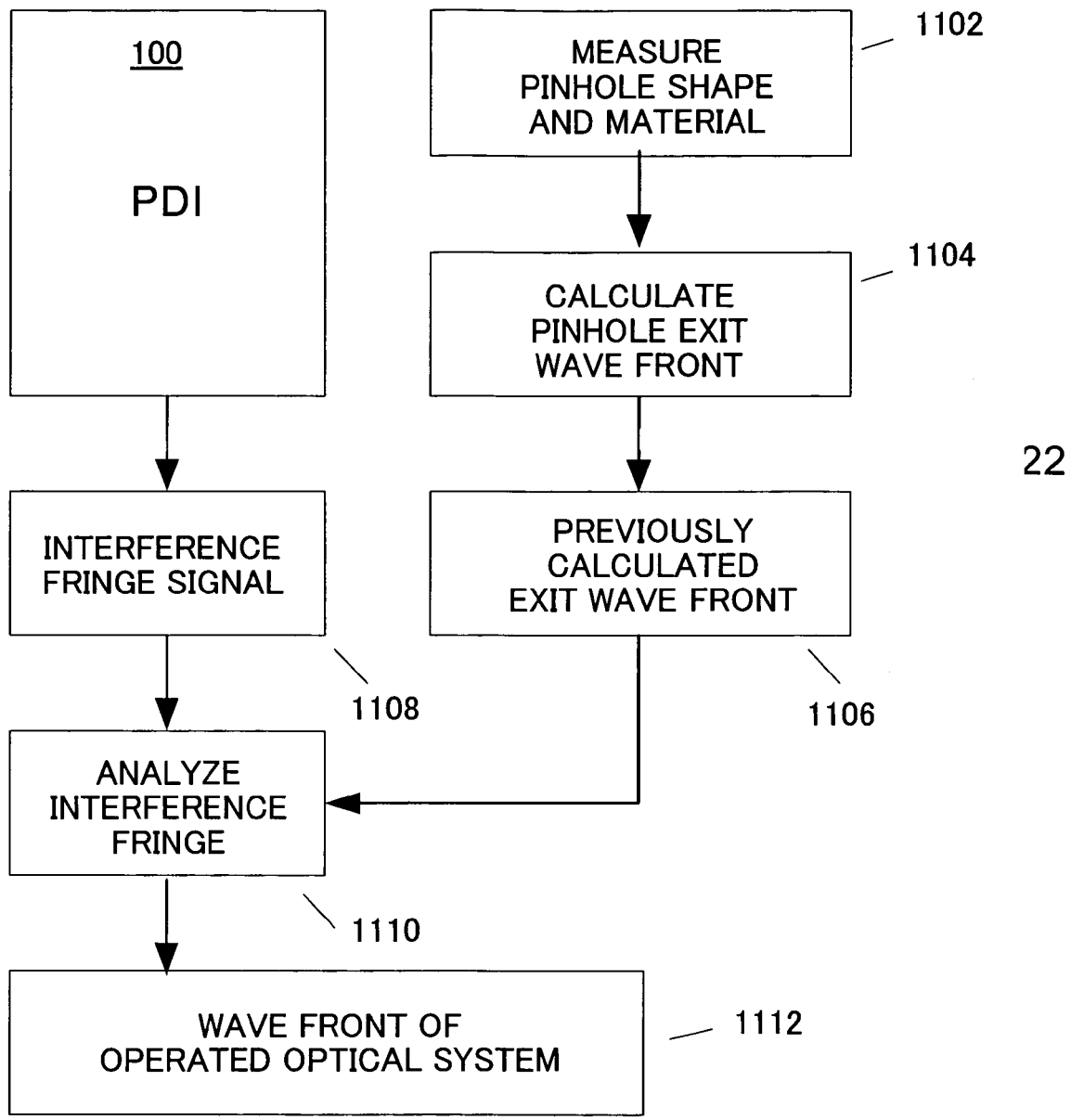
FIG. 13 is a flowchart of the interference fringe analysis for use with an error reduction of the pinhole exited wave front.

FIG. 13 shows a flowchart of the interference fringe analysis method that does not rely upon the pinhole shape error. The SEM and analysis apparatus previously measure the shapes of the pinholes 112 and 142 and the materials of the masks (step 1102). An offset is calculated between the pinhole exited wave front and the wave front of the ideal spherical wave using the measurement result as a parameter and strict electromagnetic analysis approach etc. (step 1104). The exited wave front is stored as the calculation result in the memory 164 etc. (step 1106). On the other hand, the detector in the PDI 100 converts the interference fringe intensity distribution of the optical system 102 into the interference fringe signal as an electric signal (step 1108). Then, the controller 162 analyzes the interference fringe using the interference fringe signal and the exited wave front (step 1110), and calculates the wave front of the target optical system 130 (step 1112).

The instant analysis approach implements the measurement system that can precisely measure the surface precision of the target optical system 130, even when the wave fronts exited from the pinholes 112 and 114 offset from the ideal spherical wave due to the pinhole shapes and the mask materials. Alternatively, the exited wave front can be calculated by measuring the optical performance changes of the pinhole shape and the mask material using a sensor etc. while the mask 140 is mounted on the PDI 100 body. In this case, the controller 162 stores the pinhole exited wave front previously calculated with conceivable parameters as a table in the memory 164, refers to this table while obtaining the interference fringe signal, and analyzes the interference fringe using both data. This results in the high-speed measurement with good precision.

A description will now be given of an aberration correction method according to one embodiment of the present invention. The exposure apparatus 200 allows plural optical elements (not shown) in the projection optical system 130 to move in the optical-axis direction and/or a direction orthogonal to the optical-axis direction. By driving one or more optical elements using the driving system (not shown) for aberrational adjustments based on aberrational information obtained from the instant embodiment, it is possible to correct or optimize one or more aberrations of the projection optical system. The means for adjusting the aberration of the projection optical system 130 can use various known system, such as a movable lens, a movable mirror (when the projection optical system is a catadioptric optical system or full-mirror optical system), an inclinable parallel plate, a pressure-controllable space, and a surface correction using an actuator.

Thus, the exposure apparatus 200 uses the PDI 100 to correct the surface precision of the projection optical system 130 and adjust the target optical system, reducing or eliminating the aberration of the projection optical system 130. The exposure apparatus 200 mounted with the PDI 100 can measure the optical performance of projection optical system 130 without disassemble the projection optical system 130 (i.e., on machine measurement).

Figure 14:
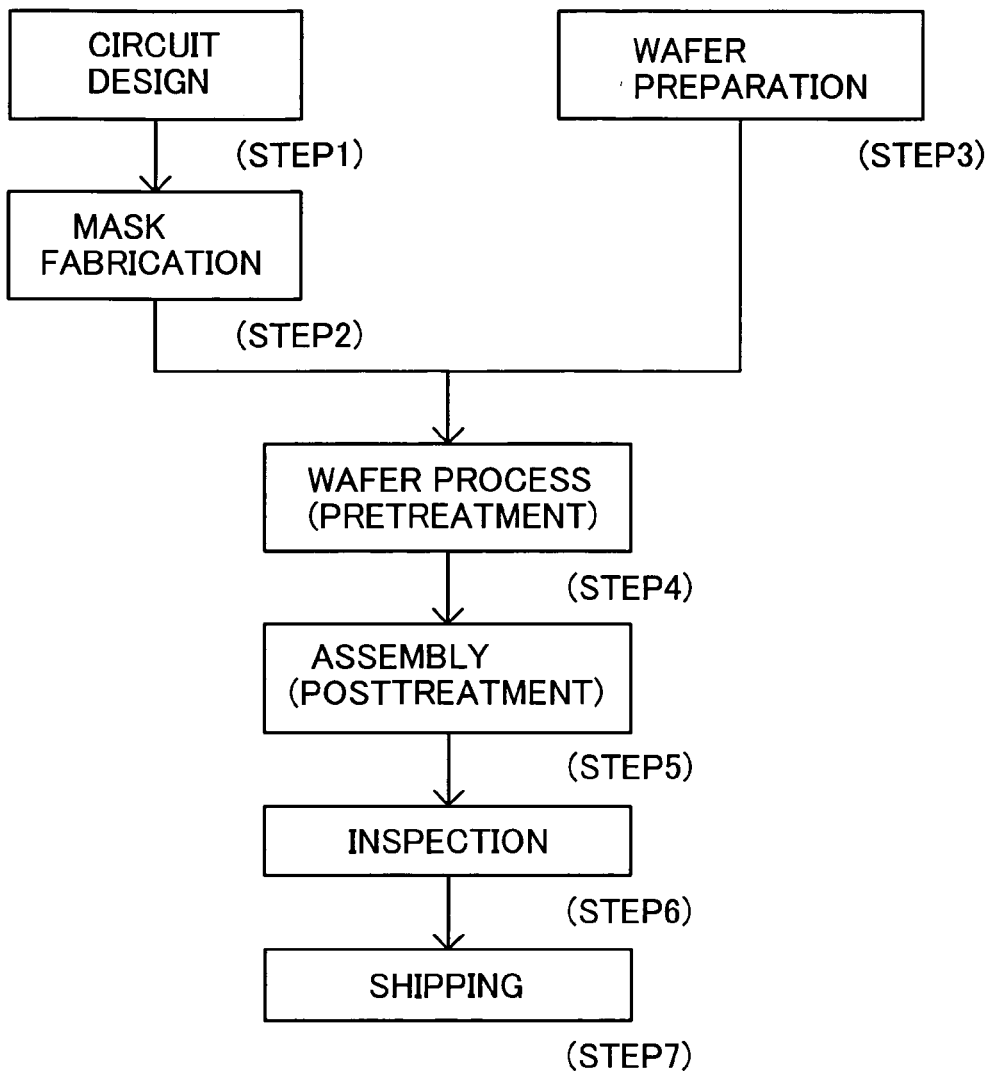
FIG. 14 is a flowchart for explaining a method for fabricating devices (semiconductor chips such as ICs, LSIs, and the like, LCDs, CCDs, etc.).
Figure 15:
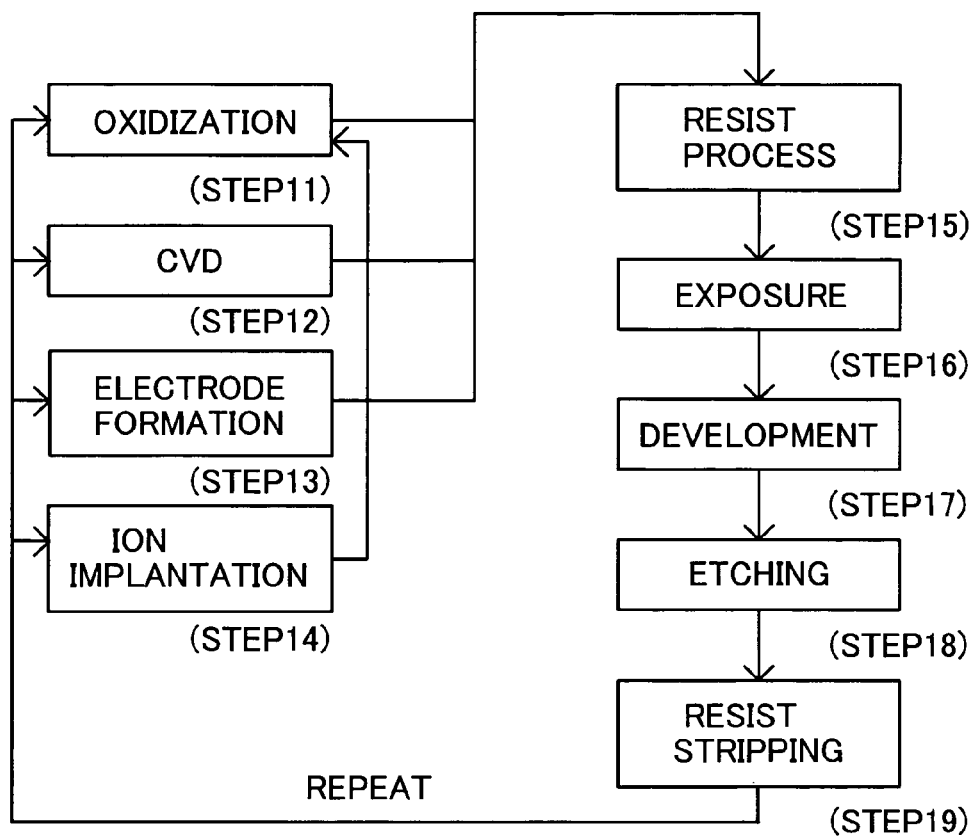
FIG. 15 is a detailed flowchart for Step 4 of wafer process shown in FIG. 14.

Referring now to FIGS. 14 and 15, a description will now be given of an embodiment of a device manufacturing method using the exposure apparatus 200. FIG. 14 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 15 is a detailed flowchart of the wafer process in Step 4 shown in FIG. 14. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The manufacturing method of the present invention can manufacture semiconductor devices, such as semiconductor devices, LCD devices, image pickup devices (e.g., CCDs) and thin-film magnetic heads, which have been difficult to manufacture, because the wave front aberration has been corrected with high precision. Thus, the device manufacturing method that uses the exposure apparatus 100, and its resultant (intermediate and final) products also constitute one aspect of the present invention.

As discussed above, the polarization direction dependency of the wave front shape generated from the pinhole can be reduced when the polarization state of the incident light is made close to the linear polarization and the elliptical pinhole is applied to the PDI 100. Since the wave fronts of the incident light and the light that transmits through the projection optical system do not fluctuate according to the polarization dependency of the optical element, and thus the PDI 100 serves as a precise surface precision measuring apparatus.

This application claims a foreign priority based on Japanese Patent Application No. 2004-055264, filed Feb. 27, 2004, which is hereby incorporated by reference herein.

What is claimed is:

1. A point diffraction interferometer for measuring optical performance of a target optical system based on a light intensity distribution of an interference fringe, said point diffraction interferometer comprising a means for interfering a wave front that passes the target optical system and a reference wave front generated from a pinhole,
wherein the pinhole satisfies:
$1.05 \leq$ ellipticity $\leq 1.16$,
where the ellipticity is defined as a diameter of a pinhole in a direction perpendicular to a linear polarization direction of light incident upon the pinhole, divided by a diameter of the pinhole in the linear polarization direction.

2. A point diffraction interferometer according to claim 1, wherein the ellipticity minimizes a wave front aberration emitted from the pinhole within a range of $1.05 \leq$ ellipticity $\leq 1.16$.

3. A point diffraction interferometer according to claim 1, further comprising:
a memory for storing a corrective coefficient in calculating the optical performance based on an offset between an ideal spherical wave and each of various first wave fronts that can be emitted from the pinhole; and
a controller for selecting one of the first wave fronts which one is the closest to a second wave front that is actually emitted from the pinhole, and for correcting, using one of the corrective coefficients corresponding to the one of the first wave fronts, the optical performance of the target optical system.

4. An exposure method comprising the steps of:
calculating optical performance of a projection optical system using a point diffraction interferometer according to claim 1;
adjusting the projection optical system based on the optical performance of the projection optical system, which is calculated by said calculating step; and
exposing an object using an exposure apparatus that includes the projection optical system adjusted by said adjusting step.

5. An exposure apparatus comprising:
a projection optical system for transferring a pattern of a mask onto an object to be exposed, using light from a light source; and
a point diffraction interferometer according to claim 1 for measuring optical performance of said projection optical system.

6. An exposure apparatus according to claim 5, wherein the light has a wavelength of 20 nm or smaller.

7. An exposure apparatus according to claim 5, wherein said projection optical system has a numerical aperture between 0.20 and 0.30.

8. A device manufacturing method comprising the steps of:

exposing an object using an exposure apparatus that includes a projection optical system for transferring a pattern of a mask onto an object to be exposed, using light from a light source, and a point diffraction interferometer according to claim 1 for measuring optical performance of said projection optical system; and developing the object that has been exposed.

* * * * *

UNITED STATES PATENT AND TRADEMARK OFFICE
CERTIFICATE OF CORRECTION

PATENT NO. : 7,304,749 B2  Page 1 of 1
APPLICATION NO. : 11/064558
DATED : December 4, 2007
INVENTOR(S) : Akinori Ohkubo It is certified that error appears in the above-identified patent and that said Letters Patent is hereby corrected as shown below:

IN THE CLAIMS:

Column 10, line 45, claim 3, line 9, "emiffed" should read --emitted--.

Signed and Sealed this

Fifteenth Day of April, 2008

JON W. DUDAS
*Director of the United States Patent and Trademark Office*